(12) United States Patent
Kappelhof et al.

(10) Patent No.: US 9,146,480 B2
(45) Date of Patent: Sep. 29, 2015

(54) SUPPORT STRUCTURE FOR WAFER TABLE

(75) Inventors: Pieter Kappelhof, Delft (NL); Jerry Johannes Martinus Peijster, Maartensdijk (NL); Dennis Kemperman, Voorhout (NL)

(73) Assignee: MAPPER LITHOGRAPHY IP B.V., Deleft (NL)

( * ) Notice: Subject to any disclaimer, the term of this patent is extended or adjusted under 35 U.S.C. 154(b) by 489 days.

(21) Appl. No.: 13/607,469

(22) Filed: Sep. 7, 2012

(65) Prior Publication Data

US 2013/0063712 A1 Mar. 14, 2013

Related U.S. Application Data

(60) Provisional application No. 61/532,584, filed on Sep. 9, 2011.

(51) Int. Cl.
*G03B 27/58* (2006.01)
*G03F 7/20* (2006.01)

(52) U.S. Cl.
CPC ............ *G03F 7/707* (2013.01); *G03F 7/70783* (2013.01)

(58) Field of Classification Search
CPC .... B23Q 1/58; B23Q 11/0032; B23Q 11/001; B23Q 11/0035; B23Q 1/01; B23Q 3/18; G03F 7/70725; G03F 7/709; G03F 7/70766; G03F 7/70833; G03F 7/70758; G03F 7/70716; G03F 7/707; G03F 7/70783; G03F 7/20; G03F 7/70825; G03F 7/70708; G03F 2009/005; G03F 7/70
USPC ........................................ 355/30, 53, 72, 77
See application file for complete search history.

(56) References Cited

U.S. PATENT DOCUMENTS

| 4,758,091 A | 7/1988 | Bodine | |
|---|---|---|---|
| 6,842,226 B2 | 1/2005 | Watson et al. | |
| 7,057,193 B2 | 6/2006 | Akutsu | |
| 2003/0058425 A1 | 3/2003 | Watson et al. | |
| 2004/0008331 A1* | 1/2004 | Cox et al. | 355/53 |
| 2004/0160585 A1* | 8/2004 | Jacobs et al. | 355/53 |
| 2011/0013164 A1* | 1/2011 | Nayfeh et al. | 355/53 |
| 2011/0141449 A1* | 6/2011 | Seijger et al. | 355/72 |

FOREIGN PATENT DOCUMENTS

| EP | 2027966 A | 2/2009 |
|---|---|---|
| WO | 2009124732 A | 10/2009 |

OTHER PUBLICATIONS

International Preliminary Report on Patentability and Written Opinion of the International Searching Authority from International Application No. PCT/NL2012/050617 dated Mar. 12, 2014 (5 pages).

* cited by examiner

*Primary Examiner* — Mesfin T Asfaw
(74) *Attorney, Agent, or Firm* — Blakely Sokoloff Taylor & Zafman LLP

(57) ABSTRACT

The invention relates to a support structure for supporting a wafer table in a lithography system, said support structure comprising:
  a base comprising a reference surface,
  an interface member, made from a low thermal expansion material, arranged on top of said base and adapted for positioning said wafer table on the support structure,
  wherein said interface member is connected to said reference surface via at least one strut, and wherein the at least one strut is made from a low thermal expansion material. The invention further relates to a lithography system comprising such a support structure.

27 Claims, 4 Drawing Sheets

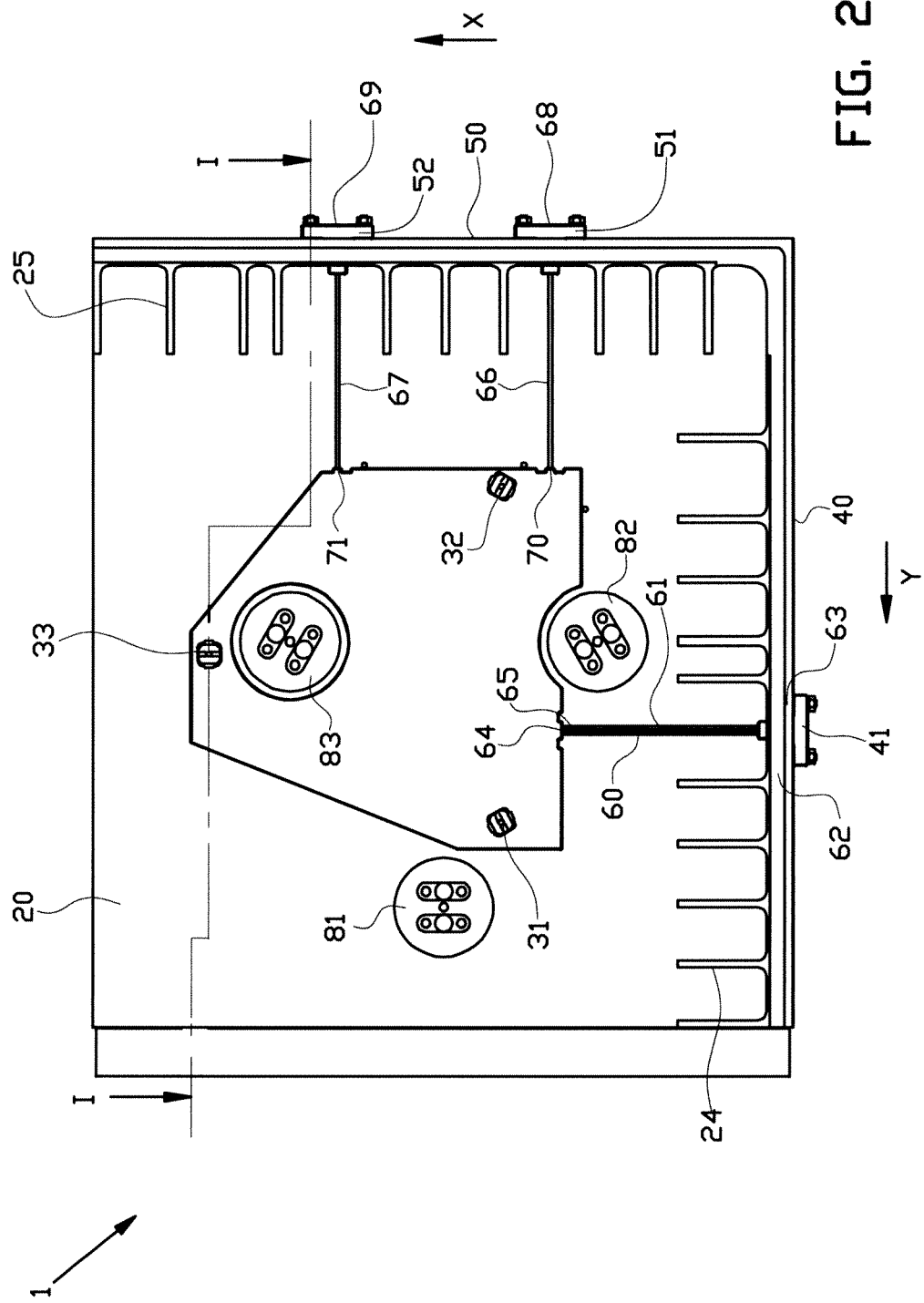

SUPPORT STRUCTURE FOR WAFER TABLE

This is a non-provisional application claiming the benefit of U.S. Provisional Application No. 61/532,584, filed Sep. 9, 2011.

BACKGROUND

The invention relates to a support structure, or chuck, for a wafer table allowing accurate positioning of the wafer table on the support structure under changing thermal conditions. Such support structures are known in the art, for instance from U.S. Pat. No. 4,758,091 describing an apparatus for positioning a work piece, the apparatus comprising support means for supporting said work piece, wherein said support means includes one or more reference planes for establishing a desired position of said work piece along at least two orthogonal coordinate directions, wherein the reference planes are comprised of a reflective surface mounted on said support means and perpendicular to a corresponding coordinate direction, substrate means for introducing translational movement to said work piece, and coupling means for coupling said support means to said substrate means such that thermal expansion of said substrate means is isolated in said support means. According to the US patent the known support means preferably comprise a material having low thermal expansion coefficient, such as Zerodur™, for fixing the spatial relationship between the reference surface and the work piece.

A drawback of the known apparatus is that low thermal expansion materials are often costly and difficult to machine.

It is an object of the present invention to provide a support structure for a wafer table which is easier and less costly to manufacture.

SUMMARY OF THE INVENTION

According to a first aspect, the present invention provides a support structure for supporting a wafer table in a lithography system, said support structure comprising a base comprising a reference surface, an interface member, made from a material having a lower thermal expansion coefficient than said base, arranged on top of said base and adapted for positioning said wafer table on the support structure, a flexible support supporting said interface member on said base, wherein said flexible support allows movement of said interface member relative to said base substantially within a plane of movement, wherein said interface member is connected to said reference surface via at least one strut, wherein the at least one strut is made from a material having a lower thermal expansion coefficient than said base, and wherein said at least one strut is substantially rigid along a direction parallel to said plane of movement. The interface member is thus moveable relative to the base, and is preferably arranged on or at a wafer table facing side of said base, which base has a different, typically higher, thermal expansion coefficient than said interface member and said at least one strut. Preferably, the thermal expansion coefficient of the interface member and/or the strut is at least 10 times lower than the thermal expansion coefficient of the base, more preferably at least 100 times lower, most preferably 1000 times lower than the thermal expansion coefficient of the base.

The at least one strut ensures that a distance between the reference surface and the interface member remains substantially constant, even when the base deforms in a manner different than the interface member, for instance due to thermal expansion. Thanks to the use of the at least one strut, a side of the interface member facing the wafer table may have a substantially smaller area than a corresponding side of the base facing the wafer table, such that the amount of material needed for manufacturing the interface member is substantially reduced, and thus also reducing costs for material and machining of the interface member.

In an embodiment, the reference surface is a substantially planar surface perpendicular to the plane of movement and/or perpendicular to a side of the base which faces the interface member. The reference surface is thus suitable for reflecting beams, such as interferometer beams, or fields, such as capacitative fields, parallel to the plane of movement and/or side of the base which faces the interface member.

In an embodiment the reference surface comprises a reflective surface of a mirror, preferably arranged at an edge, more preferably and outer edge, of the base, allowing position determination of the support structure using one or more interferometers. The mirror is preferably a planar mirror having a reflective surface perpendicular to the plane of movement and/or to the side of the base facing the wafer table.

In an embodiment the reference surface is a first reference surface and said at least one strut comprises one or more first struts, said base further comprising a second reference surface substantially perpendicular to the first reference surface, wherein the interface member is connected to said second reference surface via at least one second strut made from a low thermal expansion coefficient material. The support structure thus provides reference surfaces for measuring displacement of the support structure in a system, such as a projection system or a lithography system, in two perpendicular directions, e.g. for measuring displacement of the base relative the system in an X- and Y-direction. In an alternative, less preferred, embodiment, the first and second reference surface are at an angle to each other.

In an embodiment the at least one strut comprises two struts spaced apart from each other and extending parallel to each other. These struts, which are both connected at one end to the interface member and at another end to the reference surface of the base, substantially restrain rotation around an axis normal to the plane of movement, e.g. rotation around the Z-axis when the plane of movement is parallel to the XY-plane. It will be evident that either the first struts or the second struts, or both may comprise two or more struts. In a preferred embodiment, the number of first struts is equal to the number of second struts.

In an embodiment the struts of the first and second struts are of a substantially identical construction, facilitating manufacture of the support structure.

In an embodiment the flexible support is adapted to substantially restrict movement of said interface member relative to said base in a direction normal to said plane of movement. In other words, the flexible support is substantially rigid in said direction normal to the plane of movement. The flexible support may for instance allow movement of the interface member relative to the base along an (XY-)plane, while substantially restricting movement of the interface member relative to the base along a (Z-)axis normal to said plane.

In an embodiment, the plane of movement is substantially parallel to a wafer support plane of said wafer table, and/or substantially perpendicular to said reference surface. For instance, if a wafer is supported on the wafer table parallel to an XY-plane, then the flexible support allows movement in the XY-plane while substantially restricting tilt of the interface member relative to the base around the X- or Y-axis.

In an embodiment the at least one strut is at least substantially rigid in a longitudinal direction of said strut. The strut thus restricts movement of the interface member relative to the base along the longitudinal direction of the strut.

In an embodiment the at least one strut is flexible in a direction substantially perpendicular to said longitudinal direction. The strut thus allows some movement of the interface member relative to the base in a direction perpendicular to its longitudinal direction.

In an embodiment the at least one strut is flexible, or adapted, for bending in a plane at least substantially parallel to the base and/or substantially parallel to the plane of movement. Some movement of interface member relative to the base is thus possible parallel to said plane. Preferably the at least one strut is substantially rigid in other directions than said plane, such that movement of said interface member relative to said base is limited in those directions.

In an embodiment the at least one strut extends at least from the interface member to at least up to the reference surface. The entire distance between the reference surface and the interface member is thus bridged by the strut which comprises a low thermal expansion material, e.g. a material having a thermal expansion coefficient, which is lower than the base, preferably at least by a factor 10, and more preferably at least by a factor 100 or 1000.

In an embodiment a first end of the at least one strut is fixed to the reference surface and a second end, opposite to said first end is fixed to the interface member.

In an embodiment the at least one strut extends longitudinally substantially normal to said reference surface, and preferably substantially normal to its attachment with the interface member. Any force exerted by the strut on the interface member caused by deformation of the base along a direction normal to the reference member is thus directed substantially along the longitudinal direction of the strut.

In an embodiment the interface member is spaced apart from the base, preventing friction between said base and interface member.

In an embodiment said interface member is flexibly mounted on said base by means of a flexible support arranged between the base and the interface member. Said flexible support, sometimes also denoted flexible mount, is preferably adapted for allowing some movement of the interface member, or plate, relative to the base along at least a direction perpendicular to the longitudinal direction of the at least one strut, and parallel to the base. Preferably, the flexible support substantially limits a change in distance between the base and the interface member along a direction normal to the base.

In an embodiment the flexible support comprises a number of flexible pins, each of said pins connected on one side to the interface member and on another side to the base. The flexible support may comprise three pins arranged non-collinearly, but may alternatively comprise an array of pins, for instance as described in International patent application no. 2009/124731, which describes a lithographic apparatus having a support structure, said support structure comprising a chuck for holding an object to be exposed, a stage for supporting the chuck, and an array of shear-compliant elongated elements which extend normal to the chuck and the stage and having first ends contacting the chuck and second ends contacting the stage.

In an alternative embodiment the interface member is supported on the base via a flexible support comprising at least one of a spring mount, a fluid, liquid or paste, a sliding connection. In principle, any kind of flexible support which allows movement of the interface member relative to the base in the plane of movement may be used.

In an embodiment the flexible support has a thermal expansion coefficient which is, at least in said direction normal to the plane of movement, substantially equal to a thermal expansion coefficient of said base. Thus during temperature changes thermal expansion of the base and the flexible support along the Z-axis will be substantially similar, such that bending of the struts outside of a plane parallel to the plane of movement is substantially prevented. As a result, stress on the struts is reduced and tilting and/or rotation of the interface member relative to the base is substantially reduced or even prevented all together. Preferably, the flexible support, e.g. comprising or constituted by the pins as described herein, comprises a metal having a thermal expansion coefficient substantially equal to that of the base. More preferably, the flexible support and the base, or at least a section of the base supporting the reference surface, comprise substantially a same material, e.g. a metal such as aluminum.

In an embodiment the interface member comprises two or more positioning members spaced apart from each other and adapted for positioning said wafer table on the support structure. The positioning members thus provide an easy and accurate way in which to align the wafer table with the reference surfaces. Preferably the interface member comprises three positioning members which are spaced apart.

In an embodiment the positioning members at least substantially form a kinematic mount for said wafer table.

In an embodiment said interface member comprises a monolithic interface plate which is provided with said two or more positioning members, wherein said interface plate is preferably made from a low thermal expansion material, such as Zerodur™.

In an embodiment the interface member comprises a frame to which said two or more positioning members are fixedly and rigidly connected. The invention thus provides a rigid frame in which the relative positions between the two or more positioning members remain substantially constant, even under changing thermal conditions.

In an embodiment, the frame is a substantially hollow frame. The invention thus provides a rigid and light weight frame.

In an embodiment said base substantially comprises a material having a high thermal conductivity, e.g. higher than a thermal conductivity of the interface member, preferably wherein the material is a metal, such as aluminum. Formation of heat gradients in the base is thus substantially reduced, such that any thermal expansion of the base may be substantially uniform. Typically, the base thus has a high thermal conductivity coefficient, and a high thermal expansion coefficient, while the interface plate has a low thermal expansion coefficient and a low thermal conductivity coefficient. Preferably the thermal conductivity coefficient of the base is higher at least by a factor 10, more preferably by a factor 100, most preferably at least by a factor 135 than the thermal conductivity coefficient of the interface member.

According to a second aspect, the present invention provides a lithography system comprising a support structure as described herein.

In an embodiment said lithography system further comprises a beam source for generating one or more beams, projection optics for focusing the one or more beams onto the target, a wafer table arranged on the support structure and adapted for supporting a target to be processed in the lithography system, an actuator for driving movement of the support structure relative to the projection optics, a measurement system adapted for determining a position or displacement of the reference surface of the support structure relative to the projection optics, a controller for controlling the actuator based on said determined position or displacement. Because the position of the reference surface relative to the interface member is substantially fixed, measurements made by the measurement system provide accurate information on the position of the wafer table in the projection system.

In an embodiment said lithography system is adapted for patterning the target with said one or more beams, preferably while the support structure is being moved relative to the projection optics. Especially in maskless charged particle lithography systems, in which a target such as a wafer is moved relative to the projection optics during patterning, accurate positioning of the target relative to the projection optics is required, for instance to avoid errors in overlay or stitching of patterns.

According to a third aspect, the present invention provides a support structure for supporting a wafer table in a lithography system, said support structure comprising a base comprising a reference surface, an interface member, made from a low thermal expansion material, arranged on top of said base and adapted for positioning said wafer table on the support structure, wherein said interface member is connected to said reference surface via at least one strut, and wherein the at least one strut is made from a low thermal expansion material.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 2A shows a top view of the support structure of FIG. 1.

DETAILED DESCRIPTION OF THE INVENTION

Figure 1:
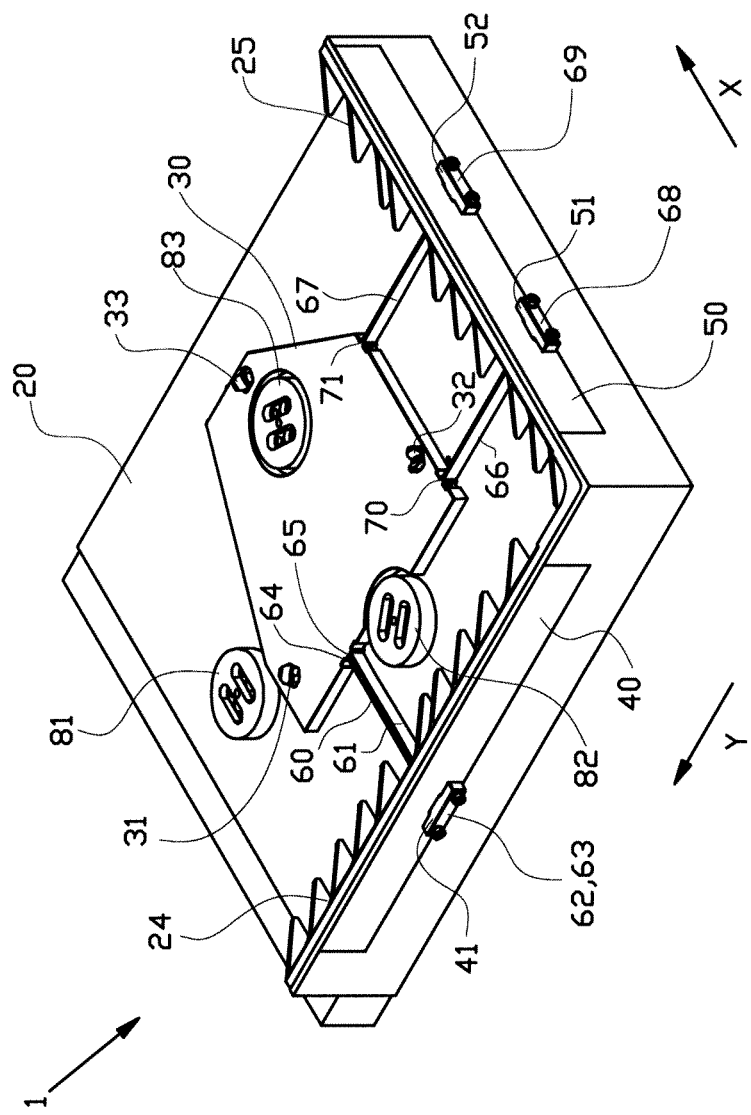
FIG. 1 schematically shows an orthogonal view of a support structure according to the present invention.

FIG. 1 shows an orthogonal view of a support structure 1, or chuck, according to the invention, adapted for supporting a wafer table and moveable in a system, such as a projection system and/or a lithography system, along directions X and Y. In a typical projection system or lithography system comprising a support structure according to the invention, the support structure is moveable along the directions X and Y, for instance for positioning a target held by the wafer table correctly with respect to projection optics of the projection or lithography system. Such a projection system or lithography system may further comprise a fine motion stage for fine tuning displacement of the wafer table in six degrees of freedom.

An amount of displacement of the support structure 1 within such a system may be measured by determining a displacement between a fixed point in the system and first reference surface 40 of the support structure, and/or second reference surface 50 of the support structure. In the embodiment shown, the first and second reference surface each comprise a reflective surface of a mirror such that displacement of the support structure within projection system may be measured using interferometers which transmit light beams to respective reference surfaces 40,50, and receive reflections of said light beams representative of a displacement along the X and Y direction respectively.

The support structure comprises a base 20, on which the two reference surfaces 40,50 are provided perpendicular to each other and to the XY plane. When a target is placed on a wafer table which is in turn placed on the support structure 1, a surface of the target to be illuminated is substantially located in a plane intersecting the first and second reference surface. Thus the position of the target in X and Y may be measured at the level of the target surface to be illuminated. Fins 24,25 of the base 20 provide additional support for the edges of the base on which the reference surfaces 40,50 are provided.

An interface plate 30, also denoted interface member, is arranged on base 20, in such a manner that it may be moved in the XY plane of movement with respect to the base 20. The interface plate 30 is provided with three positioning members 31,32,33, for positioning a wafer table thereon, and comprising V-grooves which are oriented off-axis with respect to each other. Thus, when a wafer table having feet which mate with the V-grooves is placed on the positioning members 31,32,33, the wafer table is accurately positioned on the interface plate 30. To ensure that the positions of the V-grooves remain substantially fixed with respect to each other, even under changing thermal conditions, the interface plate 30 is made from a low thermal expansion material, such as Zerodur™. Herein, a low thermal expansion material refers to any material having a substantially lower thermal expansion coefficient than the base. The base 20 comprises a lightweight metal, aluminum, having a relatively high thermal conductivity, i.e. a higher thermal conductivity than the material of the interface plate 30. Though the base 20 may deform due to thermal expansion, the high thermal conductivity of the base 20 reduces formation of local heat gradients in the base 20 and thus substantially reduces non-uniform deformation of the base 20 due to said thermal expansion. In particular, non-homogenous deformation of the reference surfaces 40,50 is thus substantially reduced. Reference surface 40 is connected to the interface plate 30 by means of two elongated first struts 60,61 which are oriented parallel to the X direction and which are made of a low thermal expansion material as well. The first struts 60,61, which are substantially adjacent to each other, extend through the reference surface 40, and comprise first ends 62,63 which are fixed to said reference surface 40 by means of connector 41, and second ends 64,65 which are attached to the interface plate 30. Thus, any displacement of the reference member 40 along the direction X, for instance due to thermal expansion of the base, will result in a corresponding displacement of the interface plate 30, such that the distance along the X direction between the reference member 40 and any point on the interface plate 30 remains substantially constant. As the interface plate comprises a low thermal expansion coefficient material, the distance along the X direction between the positioning members 31,32,33 and the reference surface 40 remains substantially constant as well during thermal expansion of the base 20.

Reference surface 50 is connected to the interface plate 30 by means of two spaced apart elongated second struts, 66,67, comprising a low thermal expansion material and oriented with their longitudinal axes parallel to the Y direction. The second struts 66,67 extend through the reference surface 50, and comprise first ends 68,69 which are fixed to said reference surface 50 by means of connectors 51,52, and second ends 70,71 which are attached to the interface plate 30. Thus, any displacement of the reference member 50 along the direction Y, for instance due to thermal expansion of the base 20, results in a corresponding displacement of the interface plate 30, such that the distance along the Y direction between the reference member 40 and any point on the interface plate 30 remains substantially constant during thermal expansion of the base 20. First and second struts 60,61,66,67 bridge substantially the entire distance between the reference surfaces 40,50 and the interface plate. Moreover, as the second struts 66,67 are spaced apart from each other, they also substantially constrain rotation of the interface plate 30 around an axis normal to the XY plane.

The support structure 1 is adapted to be carried op top of a stage along at least said X and Y directions, and comprises attachment means 81,82,83 which are attached to the base 20 and extend through a side of the base facing away from the interface plate 30. The interface plate 30 is shaped such that it remains spaced apart from the attachment means 81,82,83, even during thermal expansion of the base. Though the interface plate 30 shown is a substantially solid plate with a hole in it for spacing the plate 30 apart from attachment means 83 allowing relatively easy machining of the plate 30, in an alternative embodiment the interface plate 30 may comprise a frame which substantially fixedly and rigidly connects the positioning members 31,32 and 33 to each other, to save material and weight of the interface plate. In this alternative embodiment said frame preferably is a substantially hollow frame. For instance, in the alternative embodiment the interface plate may comprise a substantially hollow rigid triangular frame comprising three substantially rigid struts of a low thermal expansion coefficient, preferably wherein the distal ends of the three struts form vertices of the triangular frame, and wherein each positioning member is preferably arranged near a vertex of said triangular frame.

FIG. 2A shows a top view of the support structure 1 of FIG. 1. The struts 60,61,66,67 are formed substantially identically, having equal dimensions and having substantially rectangular cross-sections. The struts 60,61,66,67 are substantially rigid along their respective longitudinal directions, and slightly flexible in respective directions substantially perpendicular to said longitudinal directions. Thus when the base 20 expands along the X direction, some movement of the second ends 71,70 of the struts 66,67 relative to their first ends 68,69 remains possible. The struts 66,67 flex equal amounts, thus substantially constraining rotation of the interface plate 30 relative to the base 20 around an axis normal to the X and Y directions.

Savings in acquiring and machining low thermal expansion material are achieved without substantially altering outer dimensions of the support structure 1, by providing an interface member 30 having a substantially smaller area than the base 20 when projected onto said base.

Figure 2B:
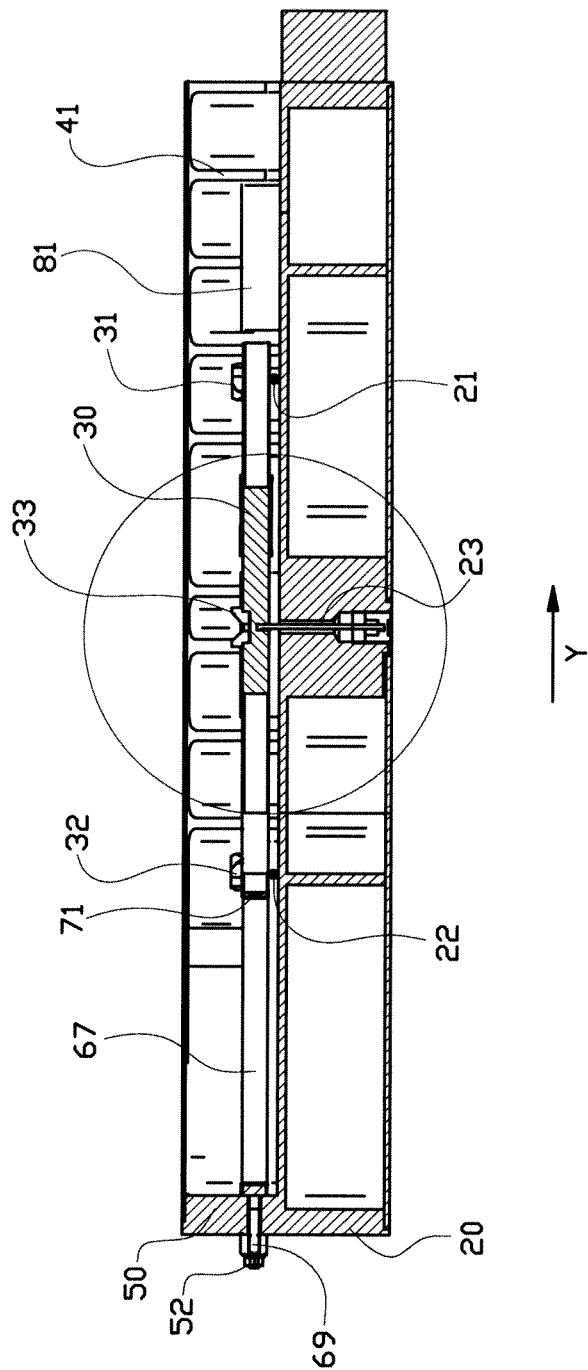
FIG. 2B shows a side view through line I-I of FIG. 2A.

FIG. 2B shows a side view along line I-I of FIG. 2A. It can be seen that the interface plate 30 arranged on the base 20 by means of a flexible support comprising a flexible pins 21,22, 23. The pins 21,22,23 are attached at first respective ends to the base 20, and at second, opposite respective ends to the interface plate 30. Though the pins 21,22,23 are adapted for allowing some movement of the interface relative to the base in the XY plane, i.e. translation along X and/or Y in said plane and/or rotation around an axis normal to said plane, they are substantially rigid along their longitudinal directions, such that the space 28 between the interface plate and the base remains substantially constant, even when the pins flex. In the embodiment shown, the flexible support comprises three pins with their longitudinal axes substantially intersecting the positioning members 31,32,33. However, any manner of moveably arranging the interface plate 30 on the base may be used, for instance using an array comprising a multitude of flexible pins, a liquid, fluid or paste contacting the interface plate and the base and arranged there between, low friction surfaces on the base and/or the interface plate, and so on.

Figure 2C:
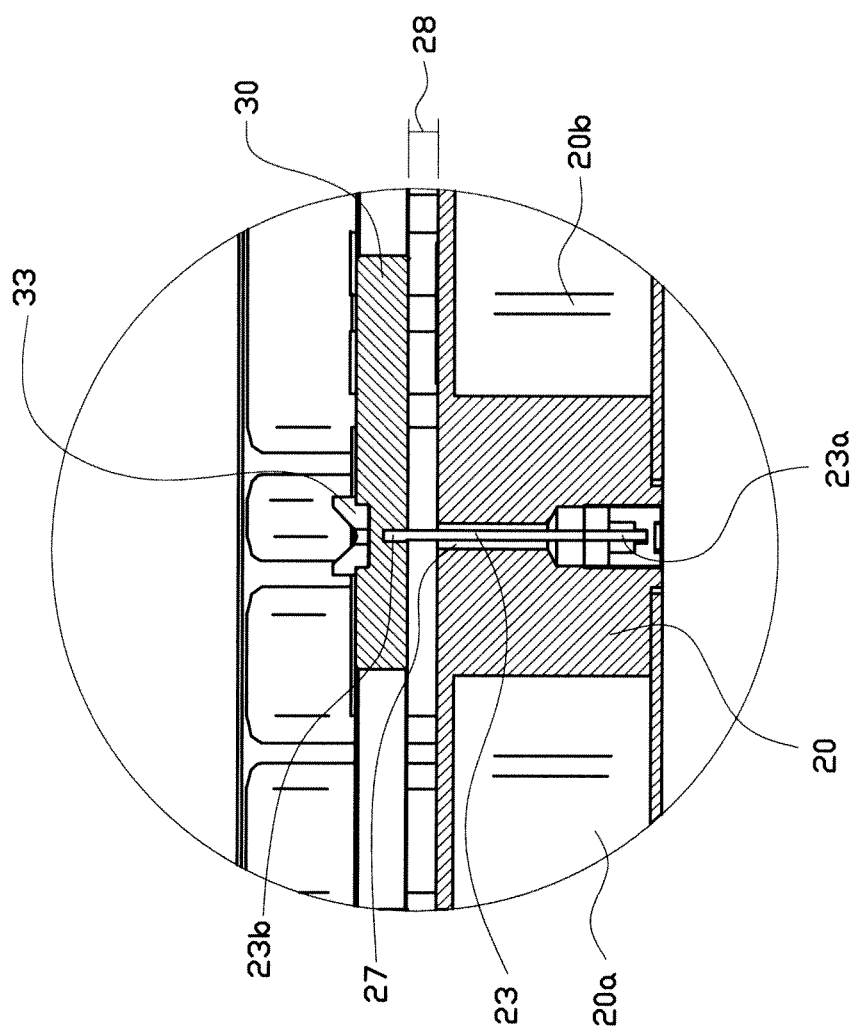
FIG. 2C shows a detail of section II of FIG. 2B.

FIG. 2C shows pin 23 and the attachment thereof with the interface plate 30 and the base 20 in more detail. The pin 23 is attached with a first end 23a to the base 20. The pin extends for a substantial part of its length through a hollow portion 27 the base, such that the pin 23, except at its first end 23a, is spaced apart from the base 20. The hollow portion 27 provides room for the pin 23 to flex in the X and Y directions, allowing the base and the interface plate to be placed in close proximity to one another while remaining spaced apart by a space 27 there between. FIG. 2C further shows in more detail that the base is constructed as a substantially hollow frame having multiple hollow interior portions 20a,20b, reducing the overall weight of the support structure even further.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Support structure (1) for supporting a wafer table in a lithography system, wherein said support structure is adapted to be moveable in said lithography system and comprises:
    a base (20) comprising a reference surface (40; 50),
    an interface member (30), made from a material having a lower thermal expansion coefficient than said base (20), arranged on top of said base and adapted for positioning said wafer table on the support structure (1),
    a flexible support (21,22,23) supporting said interface member (30) on said base (20), wherein said flexible support allows movement of said interface member relative to said base substantially within a plane of movement,
    characterized in that said interface member (30) is connected to said reference surface (40; 50) via at least one strut (60,61; 66,67), wherein the at least one strut is made from a material having a lower thermal expansion coefficient than said base, and wherein said at least one strut is substantially rigid along a direction parallel to said plane of movement,
    wherein the at least one strut is configured so that a distance between the reference surface and the interface member remains substantially constant when the base deforms in a manner different than the interface member due to thermal expansion.

2. Support structure according to claim 1, wherein the reference surface comprises a reflective surface of a mirror, preferably arranged at an edge of the base.

3. Support structure according to claim 1 or claim 2, wherein said reference surface is a first reference surface and said at least one strut comprises one or more first struts, said base further comprising a second reference surface substantially perpendicular to the first reference surface, wherein the interface member is connected to said second reference surface via at least one second strut made from a low thermal expansion coefficient material.

4. Support structure according to claim 1, wherein said flexible support is adapted to substantially restrict movement of said interface member relative to said base in a direction normal to said plane of movement.

5. Support structure according to claim 1, wherein said plane of movement is substantially parallel to a wafer support plane of said wafer table, and/or substantially perpendicular to said reference surface.

6. Support structure according to claim 1, wherein the at least one strut is at least substantially rigid in a longitudinal direction of said strut.

7. Support structure according to claim 6, wherein said at least one strut is flexible in a direction substantially perpendicular to said longitudinal direction.

8. Support structure according to claim 6 or 7, wherein the at least one strut is flexible for bending in a plane at least substantially parallel to the base.

9. Support structure according to claim 1, wherein the at least one strut extends at least from the interface member to at least up to the reference surface.

10. Support structure according to claim 9, wherein a first end of the at least one strut is fixed to the reference surface and a second end, opposite to said first end is fixed to the interface member.

11. Support structure according to claim 1, wherein said at least one strut extends longitudinally substantially normal to said reference surface.

12. Support structure according to claim 1, wherein the interface member is spaced apart from the base.

13. Support structure according to claim 1, wherein said flexible support is arranged between the base and the interface member.

14. Support structure according to claim 13, wherein the flexible support comprises a number of flexible pins, said pins connected on one side to the interface member and on another side to the base.

15. Support structure according to claim 13, wherein said flexible support has a thermal expansion coefficient which is, at least in said direction normal to the plane of movement, substantially equal to a thermal expansion coefficient of said base.

16. Support structure according to claim 1, wherein the interface member comprises two or more positioning members spaced apart from each other and adapted for positioning said wafer table on the support structure.

17. Support structure according to claim 16, wherein said positioning members at least substantially form a kinematic mount for said wafer table.

18. Support structure according to claim 16 or 17, wherein said interface member comprises a monolithic interface plate which is provided with said two or more positioning members.

19. Support structure according to claim 18, wherein said interface member is made from a low thermal expansion material, preferably Zerodur™.

20. Support structure according to claim 16, wherein said interface member comprises a frame to which said two or more positioning members are fixedly and rigidly connected.

21. Support structure according to claim 20, wherein said frame is a substantially hollow frame.

22. Support structure according to claim 1, wherein said base substantially comprises a material having a high thermal conductivity, which high thermal conductivity is higher than a thermal conductivity of the interface member.

23. Support structure according to claim 22, wherein the material is a metal, such as aluminum.

24. Support structure according to claim 1, wherein the reference surface is a substantially planar surface perpendicular to the plane of movement and/or perpendicular to a side of the base which faces the interface member.

25. Lithography system comprising a support structure according to claim 1.

26. Lithography system according to claim 25, said projection system further comprising:
    a beam source for generating one or more beams,
    projection optics for focusing the one or more beams onto the target,
    a wafer table arranged on the support structure and adapted for supporting a target to be processed in the lithography system,
    an actuator for driving movement of the support structure relative to the projection optics,
    a measurement system adapted for determining a position or displacement of the reference surface of the support structure relative to the projection optics,
    a controller for controlling the actuator based on said determined position or displacement.

27. Lithography system according to claim 26, wherein the lithography system is adapted for patterning the target with said one or more beams, preferably while the support structure is being moved relative to the projection optics.

* * * * *

UNITED STATES PATENT AND TRADEMARK OFFICE
CERTIFICATE OF CORRECTION

PATENT NO. : 9,146,480 B2  
APPLICATION NO. : 13/607469  
DATED : September 29, 2015  
INVENTOR(S) : Pieter Kappelhof, Jerry Johannes Martinus Peijster and Dennis Kemperman Page 1 of 1

It is certified that error appears in the above-identified patent and that said Letters Patent is hereby corrected as shown below:

On the Title Page, in Item [73], under Assignee, at line 2, please delete "Deleft" and insert
--Delft--.

Signed and Sealed this
Twenty-second Day of March, 2016

Michelle K. Lee
*Director of the United States Patent and Trademark Office*